(12) United States Patent
Khoshkava et al.

(10) Patent No.: US 10,366,583 B2
(45) Date of Patent: Jul. 30, 2019

(54) BISTABLE HAPTIC FEEDBACK GENERATOR

(71) Applicant: IMMERSION CORPORATION, San Jose, CA (US)

(72) Inventors: Vahid Khoshkava, Montreal (CA); Juan Manuel Cruz-Hernandez, Montreal (CA)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 15/239,962

(22) Filed: Aug. 18, 2016

(65) Prior Publication Data

US 2017/0061753 A1    Mar. 2, 2017

Related U.S. Application Data

(60) Provisional application No. 62/209,792, filed on Aug. 25, 2015.

(51) Int. Cl.
| | |
|---|---|
| H04B 3/36 | (2006.01) |
| G08B 6/00 | (2006.01) |
| H01L 41/18 | (2006.01) |
| H01L 41/193 | (2006.01) |
| G06F 3/0488 | (2013.01) |
| G06F 3/01 | (2006.01) |
| G06F 3/0354 | (2013.01) |

(52) U.S. Cl.
CPC ............... *G08B 6/00* (2013.01); *G06F 3/016* (2013.01); *G06F 3/03547* (2013.01); *G06F 3/0488* (2013.01); *H01L 41/18* (2013.01); *H01L 41/193* (2013.01); *G06F 2203/014* (2013.01)

(58) Field of Classification Search
CPC .......... G08B 6/00; H01L 41/193; H01L 41/18; G06F 3/16
USPC ......................................................... 340/407.1
See application file for complete search history.

(56) References Cited

U.S. PATENT DOCUMENTS

| | | | |
|---|---|---|---|
| 9,176,530 B2 | 11/2015 | Rothkopf | |
| 9,255,619 B2 * | 2/2016 | Zavattieri | ................. F16F 3/02 |
| 2010/0197184 A1 | 8/2010 | Browne et al. | |
| 2011/0049768 A1 | 3/2011 | Hu et al. | |
| 2015/0207058 A1 | 7/2015 | Rouvala et al. | |
| 2015/0338677 A1 | 11/2015 | Block | |

(Continued)

FOREIGN PATENT DOCUMENTS

| | | |
|---|---|---|
| EP | 2796976 | 10/2014 |
| WO | 2004109488 | 12/2004 |

(Continued)

OTHER PUBLICATIONS

Kebadze et al., "Bistable prestressed shell structures," International Journal of Solids and Structures 41:2801-2820 (2004).

(Continued)

*Primary Examiner* — Tanmay K Shah
(74) *Attorney, Agent, or Firm* — Medler Ferro Woodhouse & Mills PLLC

(57) ABSTRACT

This disclosure relates to haptic feedback generators, including bistable materials for providing haptic feedback to a user. Such haptic feedback generators are useful in structural materials, such as elements of wearables or accessories.

13 Claims, 18 Drawing Sheets

(56) References Cited

U.S. PATENT DOCUMENTS

| | | | |
|---|---|---|---|
| 2016/0187977 A1* | 6/2016 | Cruz-Hernandez | G06F 3/016 345/156 |
| 2016/0218712 A1* | 7/2016 | Ben Abdelaziz | H01L 41/25 |
| 2017/0168523 A1 | 6/2017 | Ardakani | |

FOREIGN PATENT DOCUMENTS

| | | |
|---|---|---|
| WO | 2009071919 | 6/2009 |
| WO | WO 2015/047364 | 4/2015 |

OTHER PUBLICATIONS

Guest et al., "Analytic models for bistable cylindrical shells," Proc. R. Soc. A 462:839-854 (2006).

Gude et al., "Design of novel morphing structures based on bistable composites with piezoelectric actuators," Mechanics of Composite Materials 42:339-346 (2006).

Seffen et al., "Prestressed morphing bistable and neutrally stable shells," Journal of Applied Mechanics 78:011002-1 through 011002-5 (2011).

Murray et al., "Modeling fiber composites during the cure process of piezoelectric actuation," World Journal of Mechanics 3:26-42 (2013).

Kim et al., "Flytrap-inspired robot using structurally integrated actuation based on bistability and a developable surface," Bioinspir. Biomim. 9:036004(14 pages) (2014).

Arietta et al., "A cantilevered piezoelectric bi-stable composite concept for broadband energy harvesting," Active and Passive Smart Structures and Integrated Systems, Sadono, Ed., Proc. of SPIE vol. 8688, 86880G-1 to 86880G-9 (2013).

Smith et al., "Designing light responsive bistable arches for rapid, remotely triggered actuation," Behavior and Mechanics of Multi-functional Materials and Composites, Goulbourne et al., Eds., Proc. of SPIE vol. 9058, pp. 90580F-1 to 90580F-10 (2014).

* cited by examiner

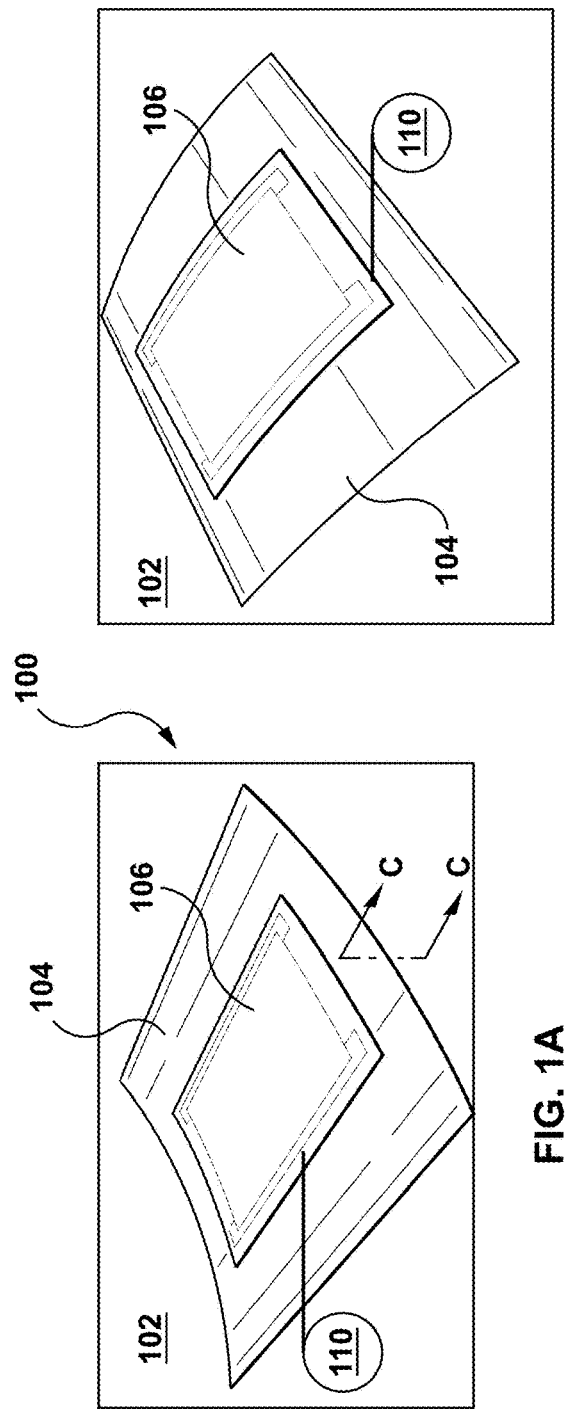
FIG. 1A
FIG. 1B
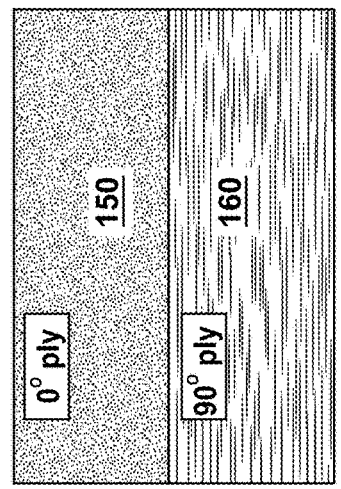
FIG. 1C

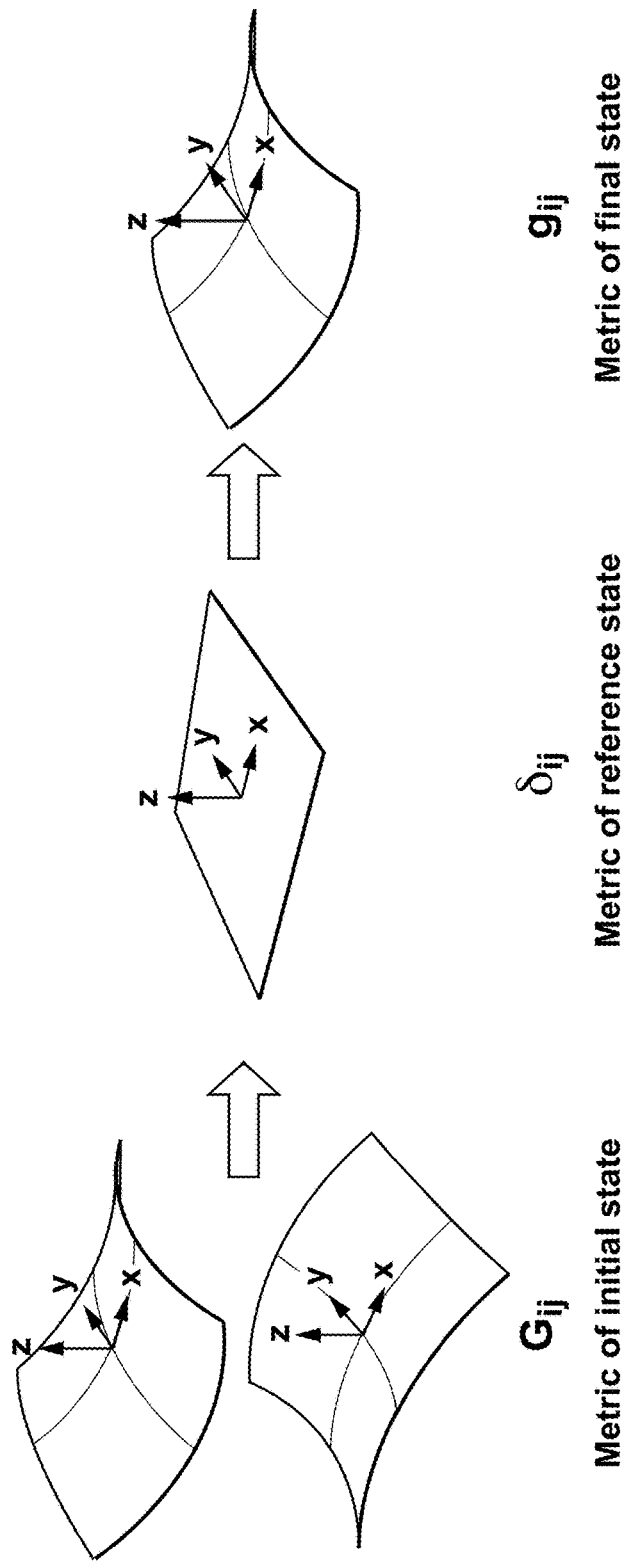

Curvatures K and the area of bistable deformation states (1) of a CFRP laminate vs. the layer thickness ratio $h_1/h$.

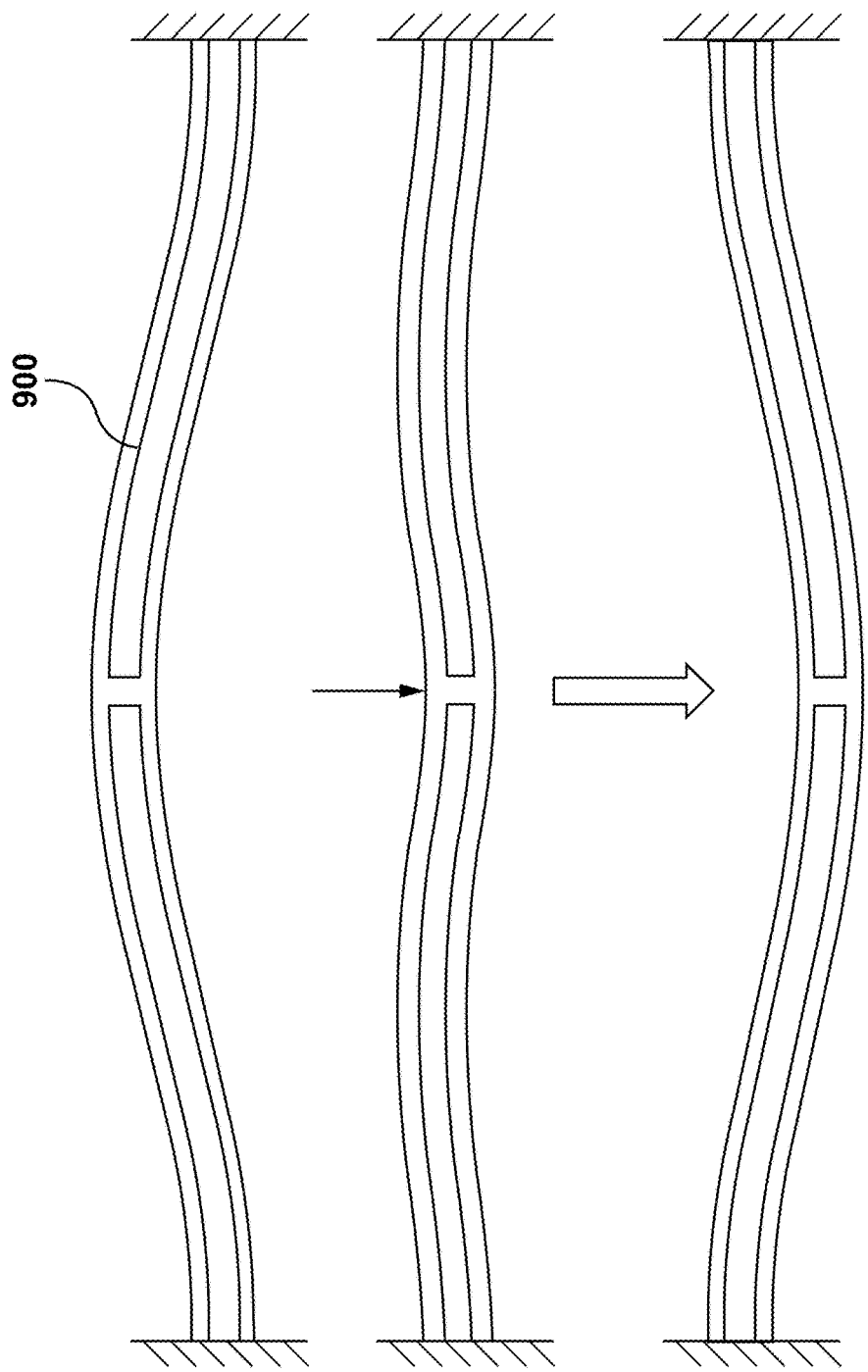

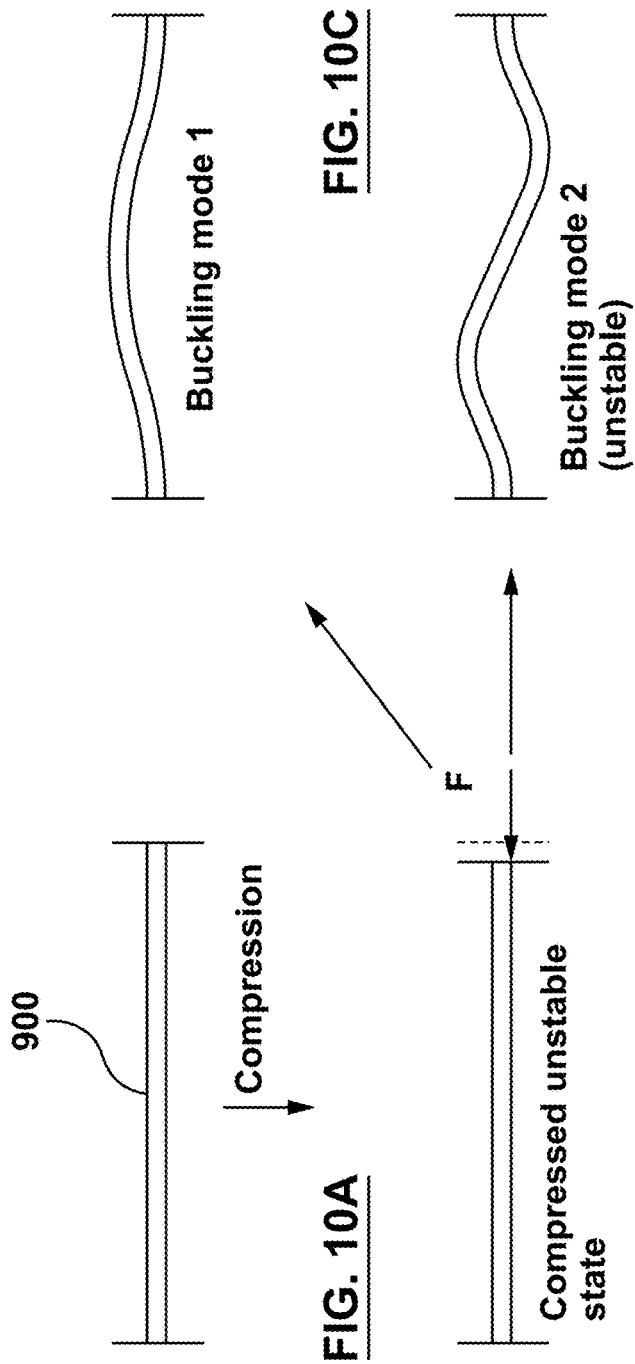

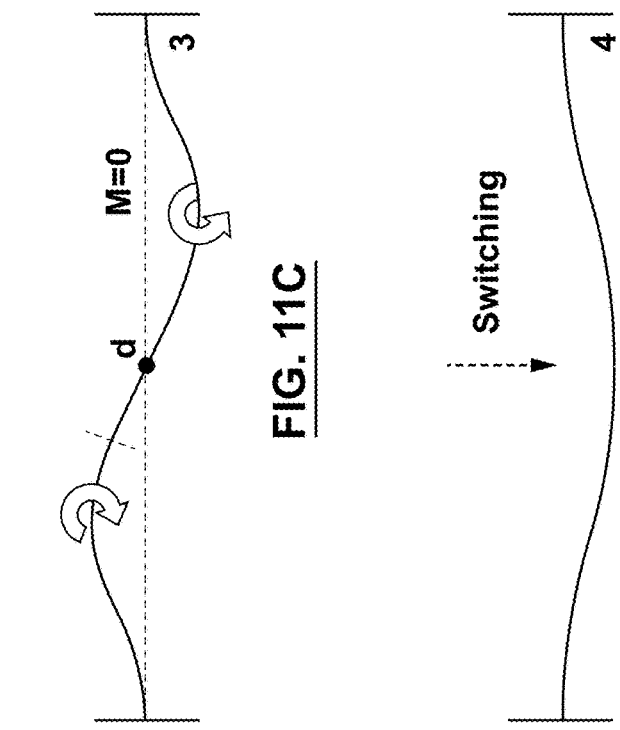
FIG. 11C
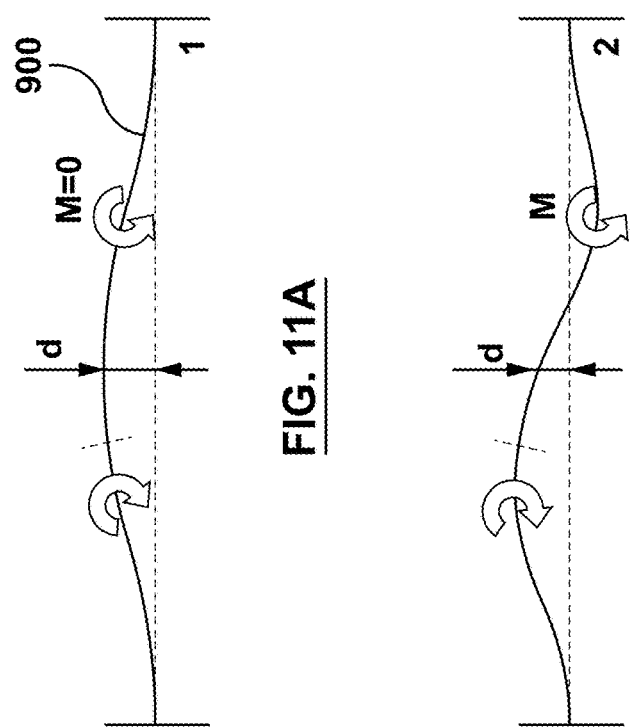
FIG. 11A
FIG. 11D
FIG. 11B

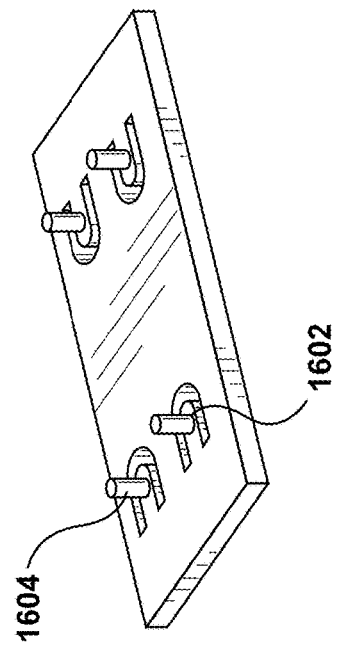
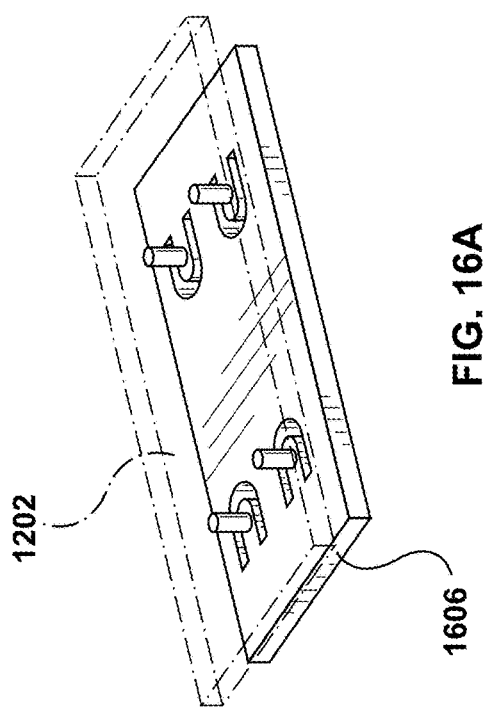
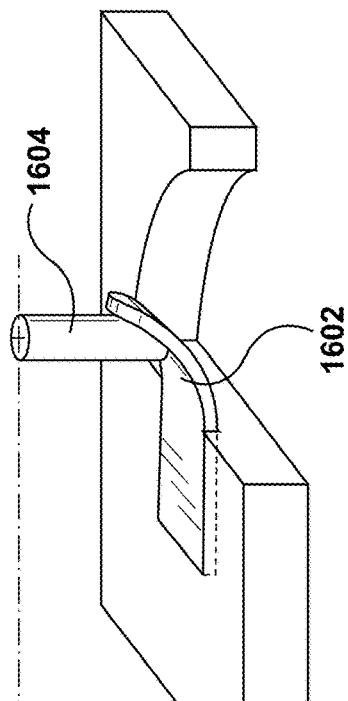
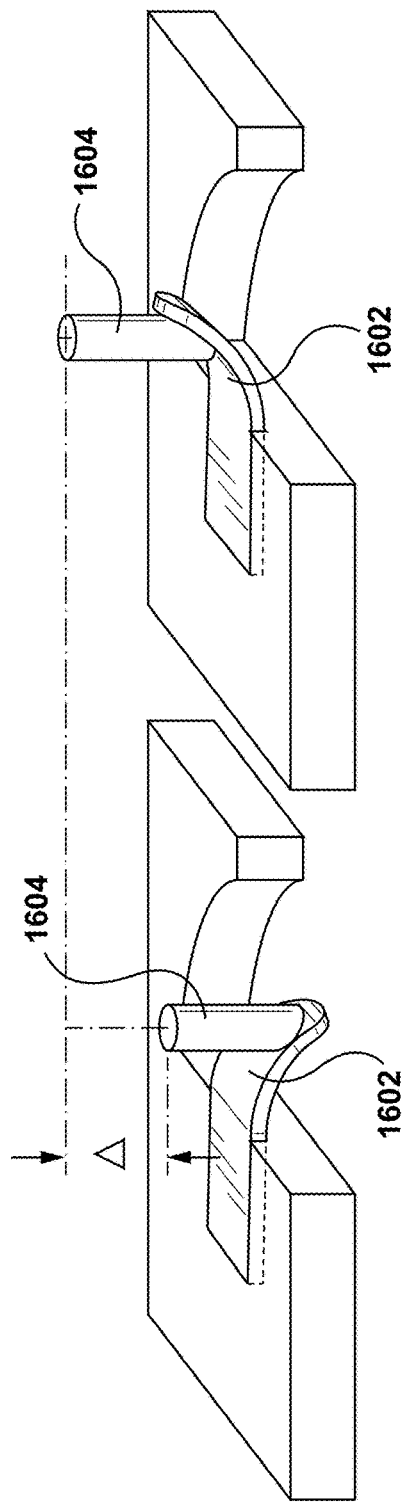

BISTABLE HAPTIC FEEDBACK GENERATOR

CROSS-REFERENCE TO RELATED APPLICATIONS

The present application claims benefit of U.S. Provisional Patent Application No. 62/209,792, entitled "Bistable Composite Textile Haptic Signal Actuator," filed Aug. 25, 2015, the disclosure of which is incorporated by reference herein in its entirety.

TECHNICAL FIELD

This disclosure relates to haptic actuators, including bistable materials for providing haptic feedback to a user. Such haptic actuators are useful in structural materials, such as elements of wearables or accessories.

BACKGROUND

Electronic device manufacturers strive to produce a rich interface for users. Conventional devices utilize visual and auditory cues to provide feedback to a user. In some interface devices, kinesthetic feedback (such as active and resistive force feedback), and/or tactile feedback (such as vibration, texture, and heat), may also be provided to the user. Haptic feedback can provide cues that enhance and simplify the user interface.

Existing haptic devices, when evaluated against power consumption specifications, may not be able to provide a user with acceptable types and levels of haptic effects, and may be overly costly and complex to produce. As a result there is a need to explore new materials to be used in haptic technology to provide ways of providing haptic feedback. In the past, primarily electromagnetic motors ERM (eccentric rotating mass), LRA (linear resonant actuator) or SMA (shape memory alloys) have been used to provide haptic feedback. As personal data devices evolve to smaller form factors, power consumption to achieve such haptic effects and innovative ways of signaling a user when a predefined condition or threshold is present, are needed.

SUMMARY

Provided herein are haptic feedback generators that include bistable materials for providing haptic feedback to users, including as elements of wearables or accessory goods.

In embodiments provided herein are haptic feedback generators, which can include a structural material, a bistable material configured in a first bistable configuration associated with the structural material, a first actuator coupled to the bistable material which when activated causes the bistable material to move from the first bistable configuration to a second bistable configuration, thereby generating haptic feedback, and a first actuator activation signal receiver, which upon receipt of a first actuator activation signal, initiates activation of the first actuator.

Also provided are methods of providing haptic feedback to a user. In embodiments, such methods include receiving a haptic initiation signal from a source, activating a first actuator coupled to a bistable material (including bistable materials associated with structural materials) when the haptic initiation signal is received from the source, and providing haptic feedback to the user by moving the bistable material from a first bistable configuration to a second bistable configuration upon activating the first actuator.

BRIEF DESCRIPTION OF THE DRAWINGS

The foregoing and other features and aspects of the present technology can be better understood from the following description of embodiments and as illustrated in the accompanying drawings. The accompanying drawings, which are incorporated herein and form a part of the specification, further serve to illustrate the principles of the present technology. The components in the drawings are not necessarily to scale.

FIGS. 1A-1B show haptic feedback generators in accordance with embodiments hereof.

FIG. 1C shows a cross-sectional view of FIG. 1A taken through C-C.

FIGS. 3A-3C show bistable materials in accordance with an embodiment hereof.

FIGS. 9A-9C show deformation states of bistable materials in accordance with an embodiment hereof.

FIGS. 10A-10D show deformation states of bistable materials in accordance with an embodiment hereof.

FIGS. 11A-11D show deformation states of bistable materials in accordance with an embodiment hereof.

FIGS. 16A-16D show bistable materials as hinges in accordance with an embodiment hereof.

DETAILED DESCRIPTION

Figure 2A:
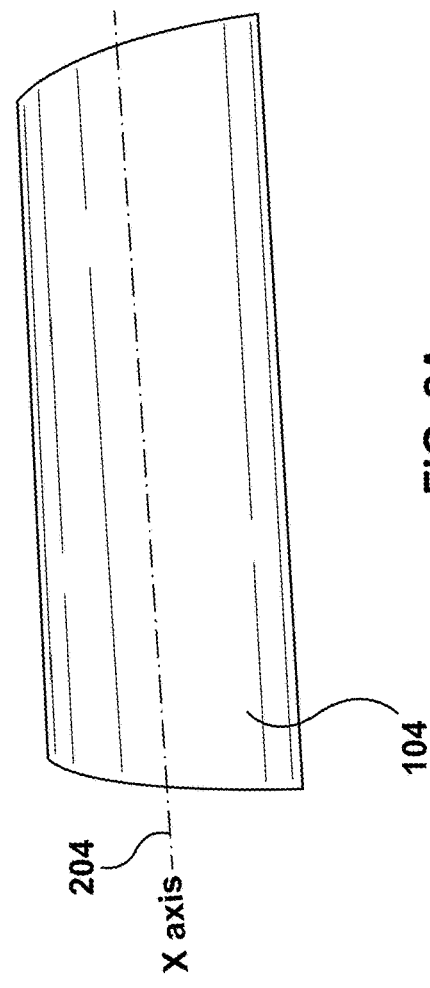
FIGS. 2A-2C show bistable materials in accordance with an embodiment hereof.

The foregoing and other features and aspects of the present technology can be better understood from the following description of embodiments and as illustrated in the accompanying drawings. The accompanying drawings, which are incorporated herein and form a part of the specification, further serve to illustrate the principles of the present technology. The components in the drawings are not necessarily to scale.

In embodiments, as illustrated for example in FIGS. 1A-1B, provided herein are haptic feedback generators 100 capable of providing haptic feedback to a user. In exemplary embodiments, haptic feedback generator 100 includes structural material 102, bistable material 104 configured in a first bistable configuration, and can be associated with the structural material (see FIG. 1A), and actuator 106 (also called actuators herein) coupled to bistable material 104, which when activated, causes the bistable material to move from the first bistable configuration (FIG. 1A) to a second bistable configuration (FIG. 1B), thereby generating haptic feedback. In embodiments, haptic feedback generator 100 also includes an actuator activation signal receiver 110, which upon receipt of a first actuator activation signal, initiates activation of actuator 106.

As used herein "haptic feedback" refers to information such as vibration, texture, and/or heat, etc., that are transferred, via the sense of touch, from a structural material as described herein, to a user. Haptic feedback can also be referred to herein as "haptic feedback signal," or "haptic signal."

As used herein, "structural material" means a material used in constructing a wearable, personal accessory, luggage, etc. Examples of structural materials include fabrics and textiles, such as cotton, silk, wool, nylon, rayon, synthetics, flannel, linen, polyester, woven or blends of such fabrics, etc.; leather; suede; pliable metallic such as foil; Kevlar, etc. Examples of wearables include: clothing; footwear; prosthetics such as artificial limbs; headwear such as hats and helmets; athletic equipment worn on the body; and protective equipment such as ballistic vests, helmets, and other body armor. Personal accessories include: eyeglasses; neckties and scarfs; belts and suspenders; jewelry such as bracelets, necklaces, and watches (including watch bands and straps); and wallets, billfolds, luggage tags, etc. Luggage includes: handbags, purses, travel bags, suitcases, backpacks, including handles for such articles, etc.

Structural material 102 shown in FIGS. 1A and 1B is illustrated simply as a section of a rectangular material, with which bistable material 104 is associated. Structural material 102 can be any shape, size, configuration and flexibility as desired, and is shown in FIGS. 1A and 1B simply to illustrate that bistable material 104 is associated with a structural element.

Various mechanisms for associating bistable material 104 to structural material 102 can be used. For example, bistable material 104 can be integrated into structural material 102. Bistable material 104 can also be made part of structural material 102 during formation of structural material 102, such as during weaving or sewing of a textile, etc.

In additional embodiments, bistable material 104 can be fixedly attached to structural material 102. In such embodiments, bistable material 104 can be glued, taped, stitched, adhered, stapled, tacked, or otherwise attached to structural material 102. Bistable material 104 can also be integrated into, or on, various substrates, e.g., polymers such as rubbers, silicones, silicone elastomers, Teflon, plastic poly (ethylene terephthalate), etc., in the form of patches, ribbons or tapes that can then be attached to structural material 102 (e.g., adhered or sewn). Such embodiments allow bistable material 104 to be easily removed and used on more than one structural material, for example, transferring from one wearable article to another.

In additional embodiments, bistable material 104 can be enclosed in an encapsulating material, suitably a water-resistant material or polymer, allowing for bistable material 104 to come into contact with water, such as during washing of a wearable, or during wearing of a wearable article where water may be present. Exemplary materials for use as encapsulating materials include various polymers, such as rubbers, silicones, silicone elastomers, Teflon, plastic poly (ethylene terephthalate), etc.

Bistable material 104 can be fabricated to undergo a fast deformation (snap buckling) when activated with a small amount of force (activation force). In embodiments, carbon fibers are oriented in layers (suitably carbon fibers embedded in a polymer matrix), such that a first layer has carbon fibers in a first orientation, while carbon fibers or layers are embedded in a second layer (suitably in a second polymer matrix) at a second orientation, about 90° to the direction of the carbon fibers in the first layer (e.g., a cross orientation) to achieve an anisotropic structure. The anisotropic structure and residual stress introduced into the material, during fabrication, make the final two layer composite, bistable.

As used herein "bistable" and "bistable materials" refers to the property of a material to exist in two distinct, stable configurations (also called bistable configurations herein), with each configuration being at a minimum energy between an energy inflection point. See FIGS. 2A-2B, illustrating a first stable configuration FIG. 2A, and FIG. 2B, illustrating a second stable configuration.

Bistable materials and structures can be made of metals (e.g., beryllium-copper), polymer composites (carbon fiber, fiber glass, etc.) and shape memory polymers (SMP). Bistable materials suitably store a residual stress which is applied to each layer of such a bistable structure, prepared as such during manufacturing. For example, a composite array/layer is designed so that the mechanical properties of a layer along a first axis (see Y axis, 202 of FIGS. 2B, 2C) is different from the mechanical properties of a second layer along a second axis (see X axis, 204 of FIGS. 2A, 2C), perpendicular to the first axis/layer. The two layers in a bistable material are then oriented so that the axes of the layers having different mechanical properties are oriented in perpendicular orientations (e.g. 0 and 90 degrees, −45 and 45, −60, 30 and etc.).

Figure 2B:
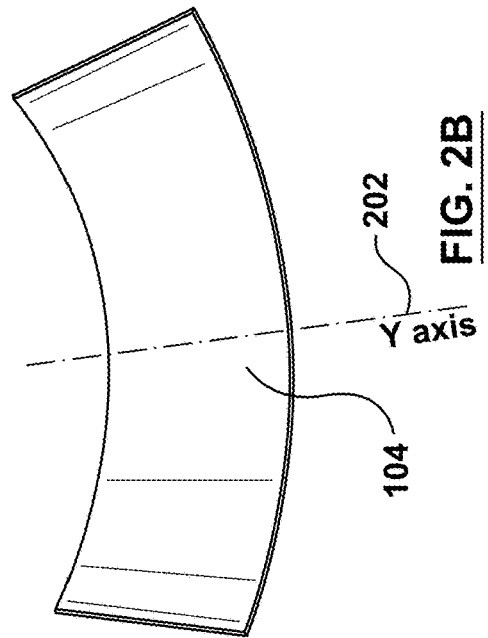
Figure 2C:
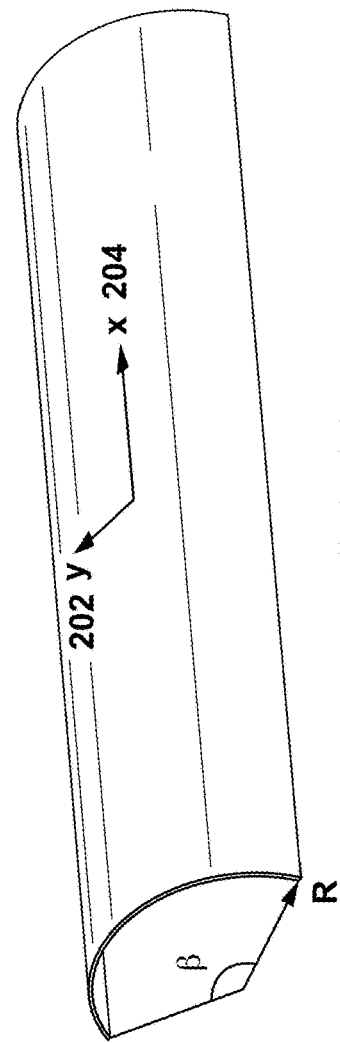

In embodiments, bistable material 104 is initially molded into a curved configuration about a first axis 204 (e.g., X axis) of bistable material 104, such as in FIG. 2A. After activation by actuator 106, bistable material 104 moves into a second curved configuration about a second axis 202 (e.g., Y axis) of bistable material 104, such as in FIG. 2B.

As described herein, bistable material 104 can include two polymer layers, see e.g., FIG. 1C, showing a cross-sectional view through bistable material 104. Each layer (e.g., 150, 160 of FIG. 1C) is suitably uni-axially oriented and bonded to the other layer with the uni-axial orientation of one of the two polymer layers being 90° to the uni-axial orientation of the second of the two polymer layers.

Exemplary actuators (106), which can also be described as bistable material actuators, include various heat sources, as well as shape memory material alloys (SMA) and macro fiber composites (MFC) coupled to bistable material 104. Methods of coupling actuator 106 to bistable material 104 include use of various adhesives and glues, mechanical mechanisms such as staples or tacks, soldering, co-melting, etc. Macro fiber composites are comprised of rectangular piezo ceramic rods sandwiched between layers of adhesive, electrodes and polyimide film. The electrodes are attached to the film in an interdigitated pattern which transfers the applied voltage MFC-structure directly to and from the ribbon shaped rods. This assembly enables in-plane poling, actuation and sensing in a sealed and durable, ready to use package. As a thin, surface conformable sheet it can be applied (normally bonded) to various types of structures or embedded in a composite structure, such as the bistable materials described herein. If voltage is applied it will bend or distort materials, counteract vibrations or generate vibrations. If no voltage is applied it can work as a very sensitive strain gauge, sensing deformations, noise and vibrations. The MFC is also an excellent device to harvest energy from vibrations.

In additional embodiments, actuator 106 is a shape memory polymer (SMP), which allows for programing of the polymer to change shape. Transformation of SMPs from one configuration to a second configuration is suitably controlled by controlling the temperature of the SMP in relation to its glass transition temperature (Tg). Raising the temperature of the SMP by heating it above its Tg, will cause the SMP to transition to its second (memorized or original) configuration, resulting in activation of the bistable material and moving or transforming from a first configuration (e.g., FIGS. 1A, 2A) to a second configuration (e.g., FIGS. 1B, 2B). Exemplary shape memory polymers include various block copolymers, such as various poly(urethanes), poly (isoprene) and poly(ether-esters).

Bistable material 104 is suitably processed (prepared) so that its geometry and material properties are oriented in a configuration to achieve the desired bistable function. For instance, in the case of a bistable metal, the geometry of the metal should be selected to produce a torque (a bending moment) in one direction in a first configuration (e.g., FIG. 2A) and in a different direction through the material when transitioned to a second configuration (e.g., FIG. 2B). As described herein, the bistable materials in embodiments have two bistable configurations along two different lines of curvatures, one along the width (e.g., axis 204) and another across the width (e.g., axis 202). This can be done by molding two bonded metals (as a bistable material) in a pre-curved mold having a radius R and a curvature angle β, as in FIG. 2C.

FIGS. 3A-3C provide a graphic illustration of the progression of the geometric transformation from an initial state of bistable material 104 (FIG. 3A), through (FIG. 3B) and to a second configuration (FIG. 3C). The X, Y and Z axes are shown and provide a reference orientation throughout the figures.

Figure 4B:
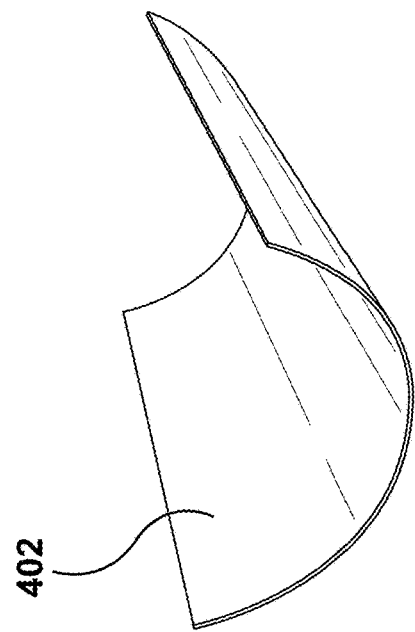
FIGS. 4A-4B show bistable materials in accordance with an embodiment hereof.
Figure 4A:
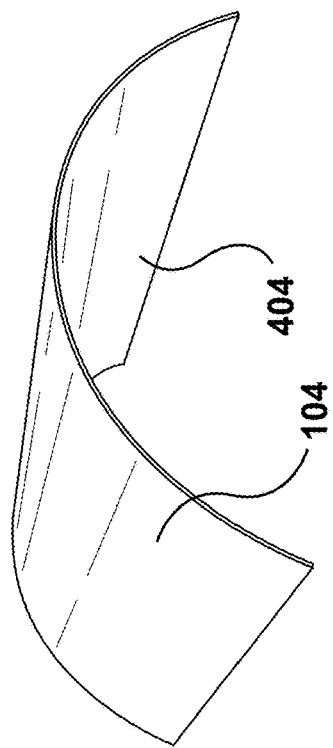

FIGS. 4A and 4B show another orientation of an initial stable configuration (FIG. 4A) of bistable material 104 and a second (FIG. 4B) stable configuration of bistable material 104 after it has been transitioned, or activated to the second configuration.

Figure 5B:
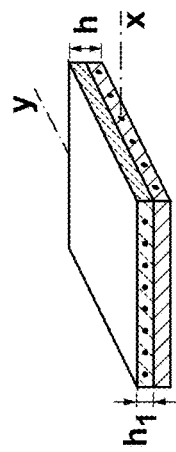
FIGS. 5A-5B show deformation states of bistable materials in accordance with an embodiment hereof.
Figure 5A:
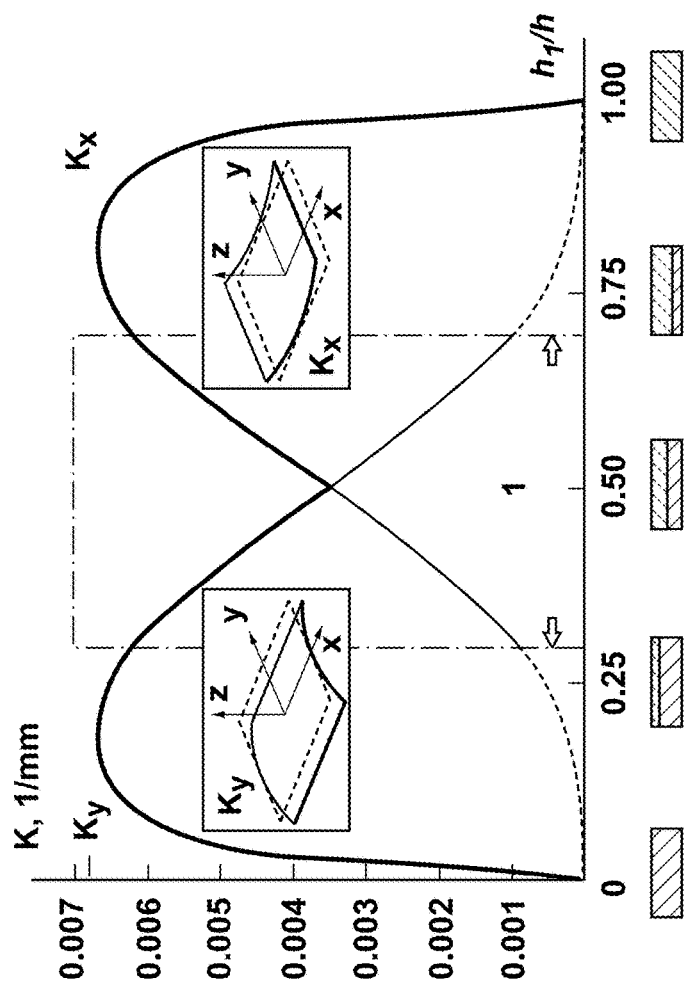

FIGS. 5A and 5B show a curve demonstrating the curvature of an exemplary bistable material as described herein, as compared to the thickness ratio between the two layers of the bistable material. It should be noted that more than two layers can also be used to prepare the bistable materials described herein (e.g., 3, 4, 5, 6, 7, 8, 9, 10, etc.), suitably arranged to create two distinct material layers having different properties, and arranged in a perpendicular pattern to each other.

Figure 6:
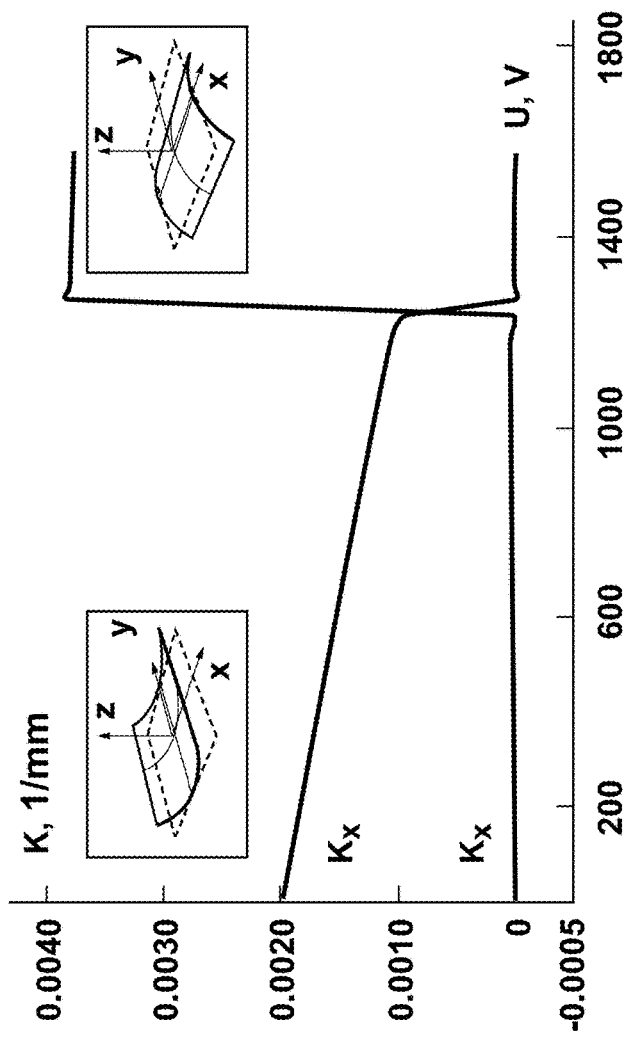
FIG. 6 shows deformation states of bistable materials in accordance with an embodiment hereof.

FIG. 6 illustrates a force profile associated with the motion of an exemplary bistable material from a first initial stable bistable configuration to a second bistable configuration.

A molding process can be applied when using a composite material to prepare bistable material 104. As described herein, the fibers inside the two polymer matrix layers should be correctly aligned, i.e., 90° to one another. As an example, the orientation of the fiber can be set at degrees 0 and 90 in the first and second layer, respectively. Other orientations such as −45 and +45 or −30 and +60 and etc. may also be used. In embodiments utilizing an SMP, the polymer material is suitably first heated above its Tg and then deformed into its desired shape (i.e. molded). The SMP material is then quenched to a temperature less than Tg. When the SMP material is again heated above its Tg, the SMP moves to its pre-set (desired or programmed) shape. The energy creating the driving force to activate (or move) the material is an external heat source. A temperature rise (also referred to as heat or thermal energy) can be indirectly generated in these materials, for example by using, magnetic fields, magnetic sources, lights, electricity, electric fields, and ultra-sound sources. A temperature rise can also be achieved by adding ingredients/fillers to the SMP which are sensitive to the aforementioned sources and can generate heat. SMP shape change can be configured to be reversible so that there is no need to program the material again for the next actuation/shape change. A typical example is a liquid crystal polymer (LCP) whose geometry (shape) changes upon heating in a reversible manner. Such liquid crystal polymers can be used as bistable materials as described herein. When the material is heated it expands and when the material is cooled it contracts, and vice versa.

Bistable material 104 can also be constructed from a series of parallel threads (e.g., polymeric fibers or metallic fibers or wires) adjacent to one another in a first layer and a second series of parallel threads adjacent to one another in a second layer, in a direction 90° to the axis of the first parallel threads.

In exemplary embodiments, SMP materials in the form of bistable material 104 can be introduced into structural material 102 (e.g., a textile) during the manufacturing, for example in the form of individual fibers which have been carefully oriented to have their memorized shape match the memorized shape of the adjacent fibers in a textile. When using SMPs there is great flexibility in configuring the SMP design geometry so as to be adapted to many different structures, structural arrangements and configurations.

Activation of bistable material 104 varies depending on the nature of the force mechanism associated with each particular configuration of the selected bistable system. Shape memory material alloy (or shape memory alloy) (SMA), macro fiber composites (MFC) or electromagnetic motors can suitably be used to activate bistable material 104, including bistable composites or metals. Further, as an example, thermal activation can be employed to activate bistable material 104 (thermal stress).

Suitably, actuator 106 is configured so that the movement of bistable material 104 is reversible. That is, bistable material 104 can be returned to its original position, or system configuration, automatically, or can be returned to the original system configuration by a user after notification/receipt of the haptic feedback.

Bistable materials as described herein suitably deform based on the residual stress that is already built up in the material. The material is ready to deform, requiring generally only a small activation. Suitably, there is some stress in the material, but it is not enough to force the material to deform. Such bistable materials generally are able to save energy, or use less energy, to actuate. For example, simply applying a small amount of pressure to a bistable material, i.e., pressure from a user's finger, the material suitably snaps and creates a high acceleration and deformation. Thus, compared to an electromagnetic actuator, this actuating mechanism consumes less power and it is not noisy. The material can be a flat and thin and light material as described herein. In addition, the material can be programmed or formed, to have particular shapes. For instance, if the material is flat, and it can have a ribbon shape or it can have a different configuration. The bistable material can be designed to have an S shape.

For bistable materials, only a small driving force is needed to raise the stress in the material above a threshold (i.e., an activation energy) so that it can cascade to a new low energy condition or snap to its other stable configuration. Such a force can be applied by attaching a piezoelectric material or shape memory material to bistable material 104, and activating the piezoelectric or shape memory material.

In exemplary embodiments, the reversibility of bistable material 104 can be provided by connecting a mechanical spring, such that when the activation is removed, the deformation comes back (is reversed). A mechanical spring mechanism can be used to make the process reversible. In a further embodiment, bilayer material 104 can be associated with two actuators 106 (e.g., MFC's or piezoelectric elements). In such embodiments, when one actuator 106 is activated, for example on an upper surface of bistable material 104 (see 402 of FIG. 4), bistable material 104 deforms, and then a second actuator 106 (for example associated with a bottom surface of bistable material 104 (see 404 of FIG. 4)) is activated and bistable material 104 goes back to its initial state (i.e., reversible).

The mechanical properties of bistable material 104 are such that, suitably, one layer should be different than the other layer, and their orientation should be crossed (i.e., normal to each other). In exemplary embodiments, a polymeric bistable material can be produced by stretching one polymer layer to make it strong in a first (one) direction (axis), e.g., 204. Then an additional polymer layer (sheet) can be stretched in a direction 90° from the initial layer. Then the two polymeric materials are suitably bound together in a mold that has the curvature desired (see FIG. 2C) and a shape of bilayer material 104 is set using a hot press, to shape the material into its initial curvature. Such a process can also be used for bistable materials comprising metals. The resulting bistable material has a cross-section as shown in FIG. 1C, with first layer 150 in a direction normal to section layer 160.

In a further example, fiber reinforced composites (e.g., epoxy or thermoplastics) can be utilized as bistable material 104.

As an illustrative example, consider that one layer of bistable material 104 already has a 50 N, (residual stress) built-in to the material, due to the manufacturing. But the residual stress is not enough to push bistable material 104 from one stable configuration to the other stable configuration. When 5 N are added externally, then the total stress inside the material, rises to 55 or 60 N, and then bistable material moves to the other stable configuration, and remains there. But again, in the second configuration, bistable material 104 has some residual stress, and again it needs external forces to move back to the first stable configuration, for example by applying the driving force generated by a motor, SMA, or MFC to push the material to go back to its first configuration, however not much added force is needed.

In comparing a bistable material and a passive material, when using a passive material, for example, 50 or 60 N have to be applied to deform the material because of the mechanical properties of the passive material. When using a bistable material, energy and the amount of added force needed are being saved and reduced, because there is already 50 N of residual stress inside the material. Thus, only an additional 10 N, for example, is needed to reach the threshold level required to move the material assembly to its other configuration. The bistable system seeks its lowest energy state, which is one of the two stable configurations. The various bistable systems described herein allow for fast deformation from one stable configuration to a second stable configuration. In embodiments, the speed of such deformation is faster than can be accomplished using motors or other mechanical actuators, where displacement over a fairly large distance (millimeters to centimeters) can occur with in a few milliseconds.

In additional embodiments described herein, structural material 102 can further comprise a second (or third, or fourth, or fifth, etc.) actuator 106 coupled to bistable material 104 which when activated causes bistable material 104 to move from the second bistable configuration to the first bistable configuration. As described herein, such additional actuators 106 can be used to drive the reversible nature of the bistable materials. In embodiments, a second actuator activation signal receiver 110, which upon receipt of a second actuator activation signal, initiates activation of the second actuator 106, resulting in the movement (return) from the second configuration back to the first configuration.

As described herein, in embodiments, structural material 102 is part of a wearable, and for example, structural material can be a textile, cloth, etc.

Figure 7:
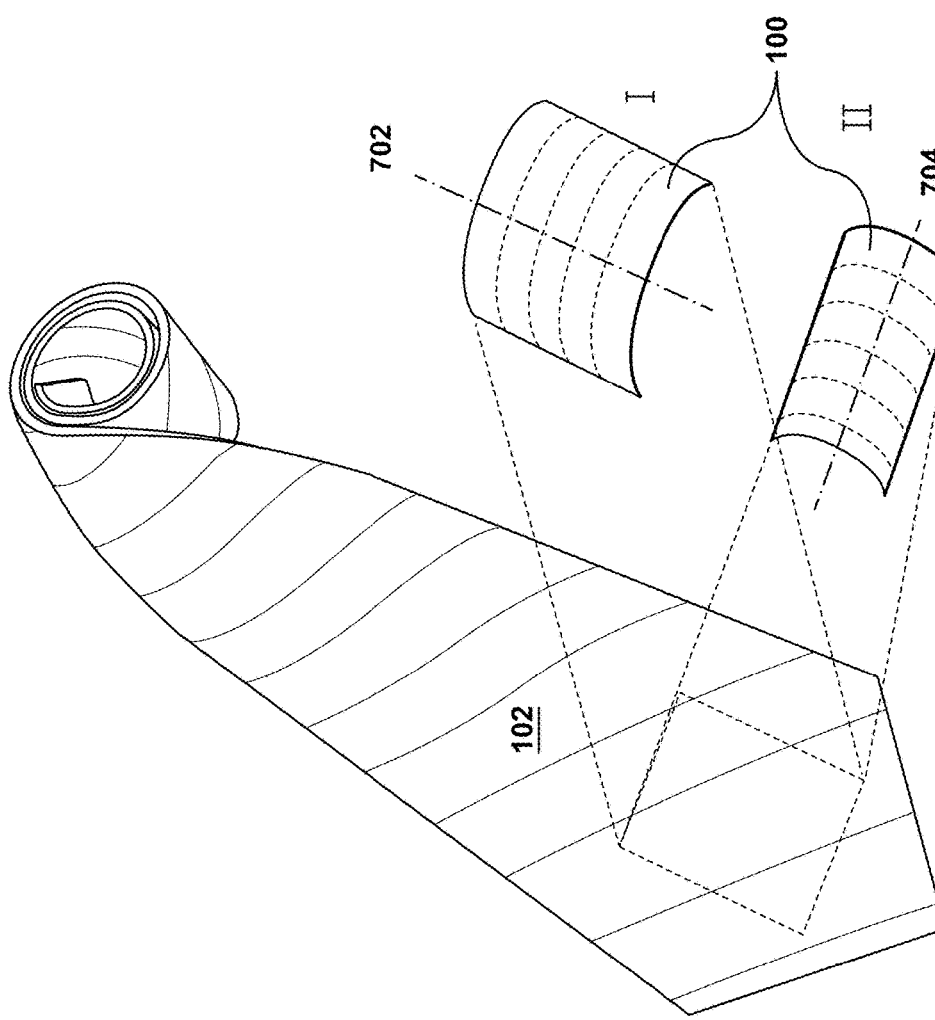
FIG. 7 shows a haptic feedback generator in accordance with an embodiment hereof, embodied as a wearable.

For example, haptic feedback generator 100 (i.e., bistable material 104+actuator 106 (e.g., polymer composite+SMA or MFC)) can be implemented in a man's tie (see FIG. 7) or a sleeve or collar of a shirt (see FIG. 8), or in other portion of a user's wearable item (e.g., textile) to provide haptic feedback. For example, a tie comprising haptic feedback generator 100, can have a curvature along first axis 704. When actuator 106 receives a signal (for example a call/message on the user's phone), haptic feedback generator 100 in the tie material, can roll or bend outward along axis 702, notifying the wearer that the condition associated with the haptic signal activation (i.e., signal from a phone) has occurred. The user can then straighten the tie or a SMA or MFC to "reset" the haptic feedback generator 100, so that it is configured to perform the function again. When using SMPs, there are more options for sources of activation, e.g., heat, thermal heating, light, laser, UV, magnetic, ultrasound, etc., all of which can be used to activate the bistable material.

Figure 8:
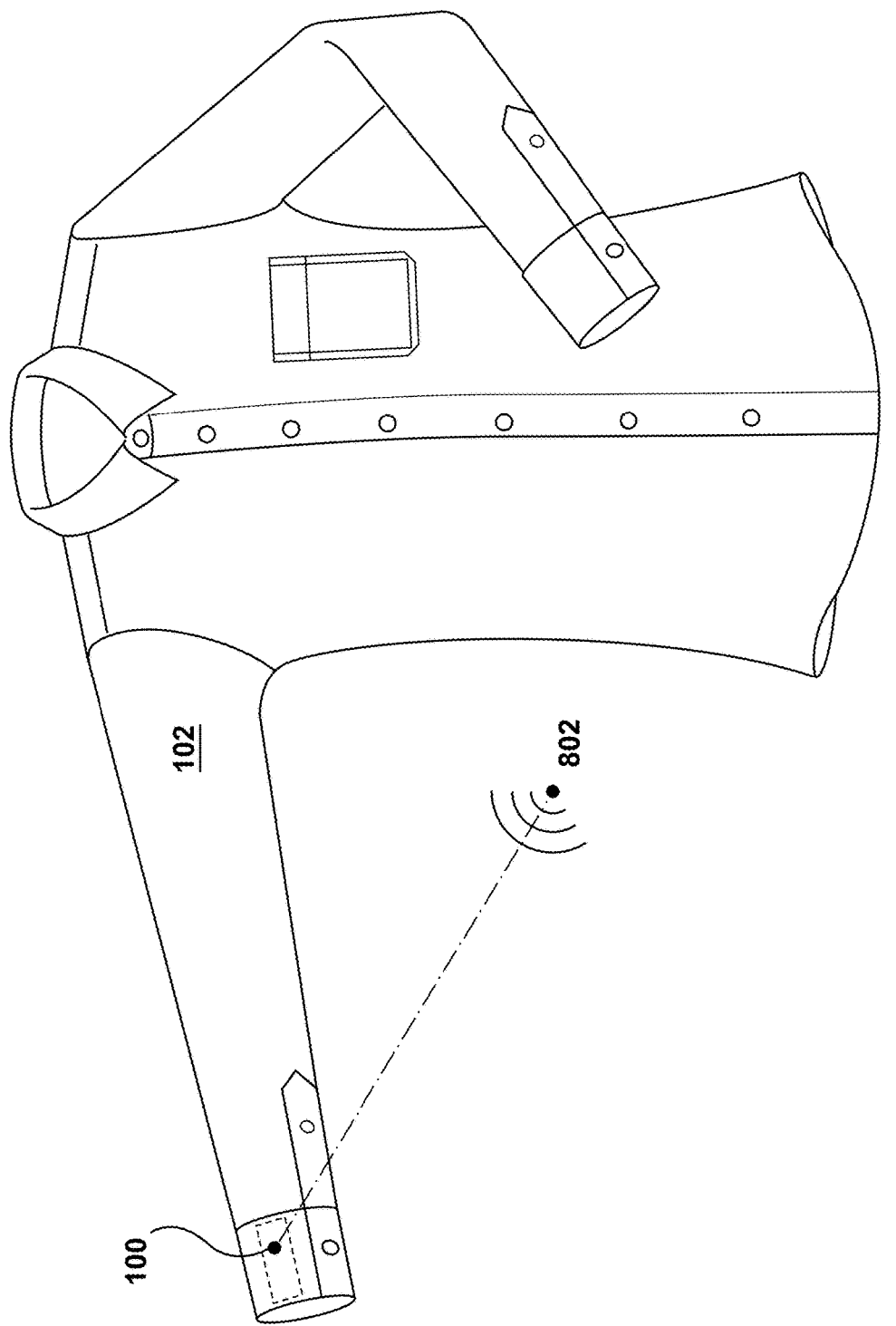
FIG. 8 shows a haptic feedback generator in accordance with an embodiment hereof, embodied as a wearable.

In an exemplary embodiment, a wearer of the textile notices a fast deformation in a portion of the textile, e.g., his tie, wherein an external device such as a cell phone has transmitted a signal to actuator activation signal receiver 110, which then alerts the user, according to the way that the user has programmed the input signal, (for example that the user has received a new email message). A user, can have haptic feedback generator 100 in the user's sleeve (e.g., FIG. 8), for example a kind of ribbon within the material of the sleeve. In further embodiments, the strap of the user's watch can incorporate haptic feedback generator 100 as described herein. In such embodiments, a user can then sense when, for example, the strap is changing its shape from circular to oval, or an elliptical shape, providing the haptic feedback against the user's wrist. Suitably the haptic feedback described herein relates to shape changes, rather than vibrations. However, haptic feedback generator 100 can be used in a vibrational mode, for example, by utilizing two (or more) actuators 106 to move bistable material 104 between stable configurations quickly resulting in a vibrational response. As illustrated in FIG. 8, structural material 102 (e.g., a man's shirt incorporating haptic feedback generator 100 in the cuff) is actuated by an external signal 802, e.g., a cell phone or other signal initiating device (computer, tablet, car, etc.).

In further embodiments, provided herein are methods of providing haptic feedback to a user. In embodiments, the methods suitably comprise receiving a haptic initiation signal from a source. In response to the haptic initiation signal, a first actuator coupled to a bistable material (including bistable materials associated with structural materials) is activated when the haptic initiation signal is received from the source. Then, haptic feedback is provided to the user by moving the bistable material from a first bistable configuration to a second bistable configuration upon activating the first actuator.

As described herein, suitably the bistable materials, if associated with structural materials, can be part of wearable. In embodiments, the bistable material comprises carbon fibers embedded in a polymer matrix. Suitably, the carbon fibers are contained in at least first and second layers, and carbon fibers in the first and second layers are oriented about 90° to one another.

In further embodiments, as described herein, the bistable material can comprise two polymer layers, each layer having been uni-axially oriented and bonded to the other layer with the uni-axial orientation of one of the two polymer layers being 90° to the uni-axial orientation of the second of the two polymer layers.

Suitably, the bistable material is initially molded into a curved configuration along a first axis of the bistable material, and wherein after the activating by the first actuator, the bistable material moves into a second curved configuration along a second axis of the bistable material.

In embodiments, the actuator is a shape memory material alloy (SMA) or macro fiber composite (MFC) coupled to the bistable material. In additional embodiments, the actuator is a heat source. As described herein, suitably the actuator is configured so that the movement of the bistable material is reversible.

FIGS. 9A-9C show bistable beam 900 comprising a bistable material as described herein, and having a parallelogram configuration. In embodiments, the bistable beam includes a top surface parallel to a bottom surface with a midpoint fixed together as shown. FIG. 9A is a first stable position in the top figure where an actuation force (FIG. 9B) causes deflection and the structure snaps through without further actuation force to FIG. 9C.

FIGS. 10A-10D show the compression (FIG. 10B) of a beam or column (e.g., bistable beam 900) so that it transforms into a buckling mode 1 (FIG. 10C). The buckling mode has a second configuration as shown in FIG. 10D, which may be unstable.

FIGS. 11A-11D show a switching chronology for a buckled beam (e.g., bistable beam 900) held between two fixed points. As a moment (M in FIG. 11B) is applied to bistable beam 900, the deformation of the beam and its motion downward occur (FIG. 11C). As that motion continues and further moment is applied there is a snap through to second stable configuration in FIG. 11D.

Figure 12A:
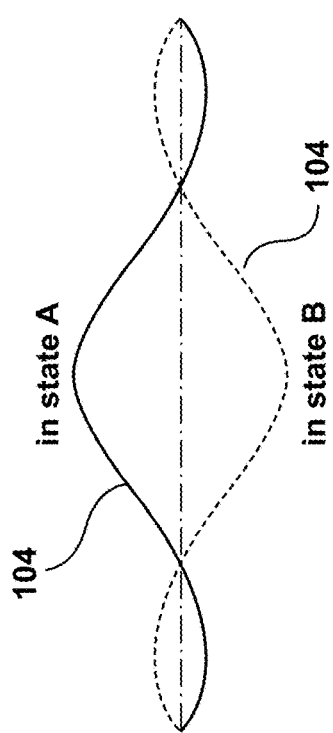
FIGS. 12A-12C show bistable materials as elements of touchpads, in accordance with an embodiment hereof.
Figure 12B:
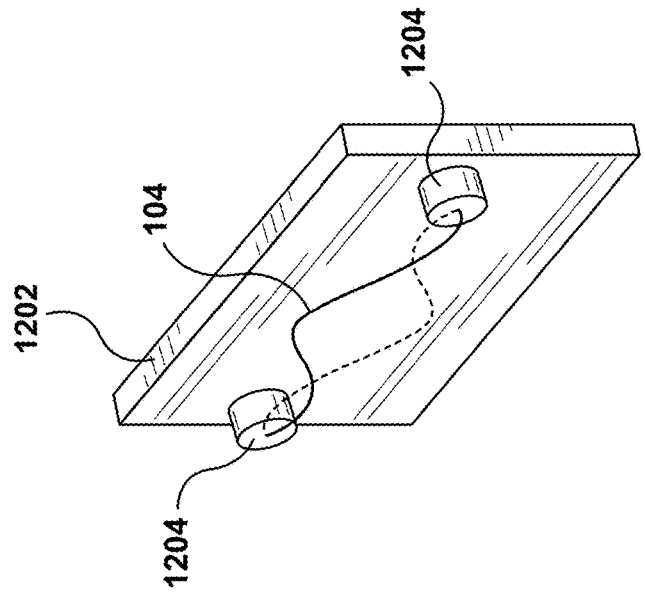
Figure 12C:
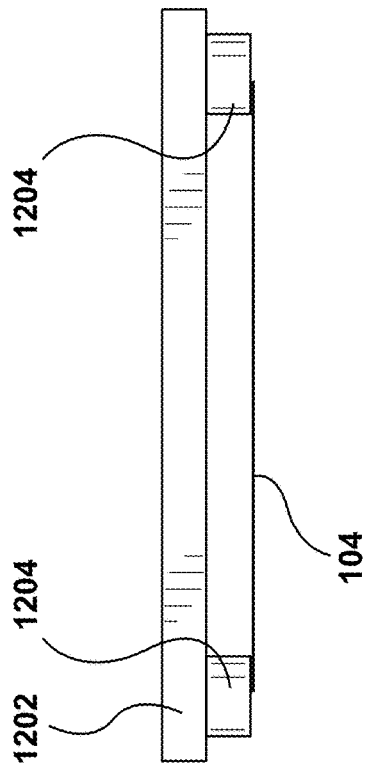

In the design shown in FIGS. 12A-12C, bistable material 104 (e.g., in the form of a rod or plate) is attached to touchpad 1202 using two pillars 1204. Bistable material 104 can switch from stage A to the state B using different activation systems as described herein. For instance, MFC material could be attached to a bistable sheet to drive it from state A to the state B. One or many bistable rods can be embedded in an electroactive polymer (EAP). The EAP matrix exerts force on bistable rods and therefore forces them to go from state A to the state B. Each side of the bistable rod could be attached to a rotating motor. For example, at the end of two cylindrical pillars the bistable material is attached/fixed to the gear of a motor. As a result of rotation (clockwise and counter clockwise), bistable material 104 can go from one state to the other state. When bistable material 104 goes from one stable state to another stable state, it creates large forces which can be transferred to touchpad 1202. Generally, bistable material 104 exhibits a high acceleration since it has a large displacement in a short time (bistable). Some mass can also be attached to bistable material 104 to improve the resultant force.

Figure 13:
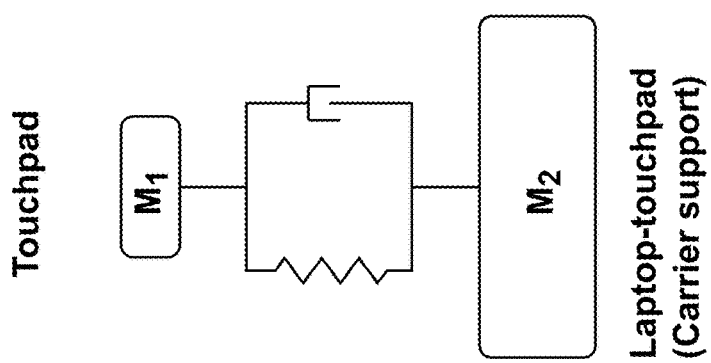
FIG. 13 shows a touchpad in accordance with an embodiment hereof.

FIG. 13 shows a classical activation and dampening system modeled after an electrical circuit for the masses of a touchpad M1 and the laptop carrier support identified as M2. This can provide a model for driving force and dampening characteristics for the mass elements shown in FIGS. 12A-12C.

Figure 14:
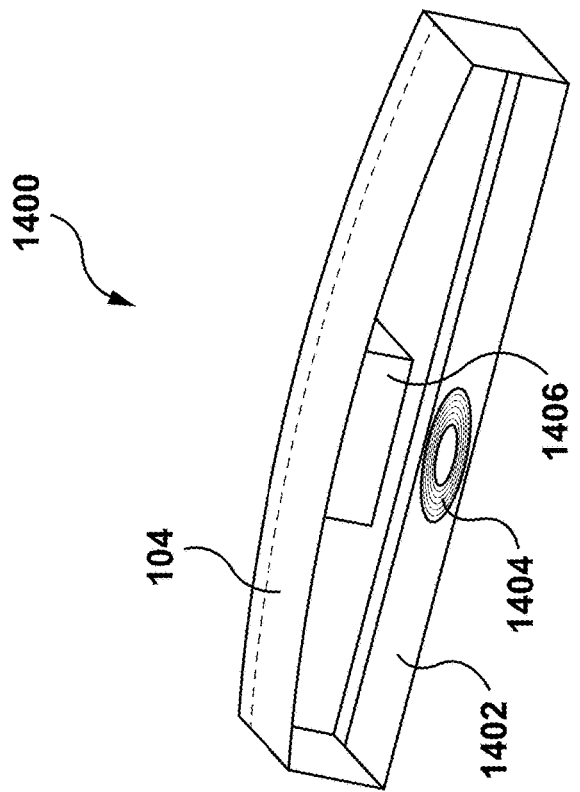
FIG. 14 shows a further bistable material in accordance with an embodiment hereof.

In further embodiments, actuators based on a bistable material 1400 are also provided. One example is shown in FIG. 14, for example, magnet 1406 can be attached to bistable material 104. Magnet 1406 is suitably attracted or repelled by coil 1404 (e.g., an air coil) suitably position or designed on the bottom surface of casing 1402. Again, due to the large displacement, a large acceleration and force are created. Actuator based on a bistable material 1400 shown in FIG. 14 can be implemented directly to any design such as a touch pad. It can be attached to a system from its casing in a similar way that LRAs or SRAs are used in haptic actuator technology.

Bistable materials 104 and actuator actuators 106 can also be used to create deformable surfaces. For example, through the use of sections or pieces of bistable materials that are activated independently, thereby creating a surface having elements that are deformed or modified relative to other elements. For example, sections of bistable materials on the order of millimeters in size (1 mm to 10 mm to 20 mm, etc.), can be utilized to create surfaces that are deformable.

Figure 15B:
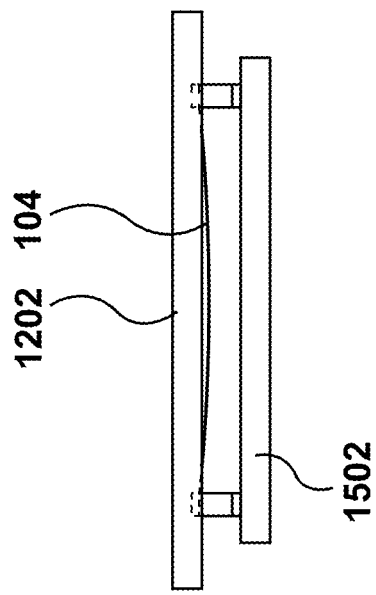
FIGS. 15A-15B show a touchpad in accordance with an embodiment hereof.
Figure 15A:
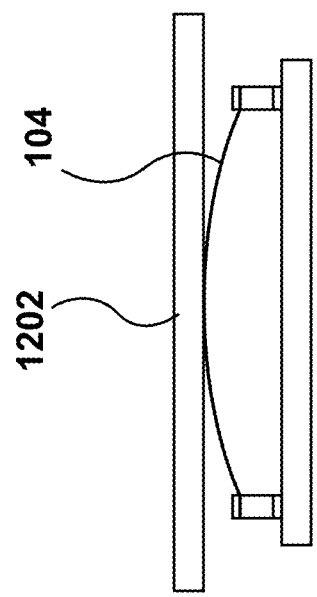

In further embodiments, bistable material 104 can be attached directly to touchpad 1202 as shown in FIGS. 15A-15B. If a user presses "gently," bistable material 104 can act as an elastic material meaning that it flattens and then comes back to its original/initial state. In this case it acts as a passive and elastic material. For instance, user just uses touch pad 1202 to click on an item. This is similar in sensation to the situation when using a keyboard, for example when pressing a key and pushing down the metal underneath the key and when the key is released it comes backs to its initial state. Such is illustrated in FIG. 15A. In other words, touch pad 1202, shown in FIG. 15A, just goes down and comes back (there is no bistable action).

In another scenario, for example a user wants to hold an item and drag it in connection with a touch-screen application. In this case, a user inputs a higher force and bistable material 104 goes from one stable state to the other stable state and stays in the second state. This is illustrated in FIG. 15B. Bistable material 104 stays in this second stable state as long as the user continues the dragging action. Once the user releases the touch, i.e., stops the dragging action, bistable material 104 goes back again to the initial state (FIG. 15A), where the user can press again to push the bistable material to the second state for a further action. In embodiments, the releasing mechanism can be performed by an external driving system. From FIG. 15A to FIG. 15B, the systems are suitably designed to use user contact as the driving force and for the release mechanism. Suitably, when user has finished their drag action, the actuator is designed to be actuated from a location (e.g., 1502) under bistable material 104 to push it up to its original state.

The various bistable materials described herein, for example shape memory polymers, can also be used as hinges. For example, a thread shaped material can be connected to other parts by a shape memory polymer, like a hinge. In embodiments, when the shape memory polymer is activated, a bending force is activated. Such a configuration suitably bends the whole structure in the first direction and then back in the previously described reversible process. In such embodiments, bistable materials, including shape memory polymers, can be used as flexible hinges. When activated it deforms to for example, a 90° angle and when the process is reversed, the shape of the shape memory polymer can be flat.

Examples of bistable material hinges 1602 are illustrated in FIGS. 16A-16D. Touch pad 1202 is suitably mounted on bistable material hinges 1602 or strips (can also be multi-stable, i.e., have 2 or more stable configurations) via pillars 1604. The hinges can have two or multi stable configurations and are suitably part of a carrier 1606. Haptic feedback suitably can be provided to the user through bistable material hinges 1602 in non-vibration or vibration mode.

For instance when a user contacts touchpad 1202, bistable material hinges 1602 are forced to their up or down stable (one of the bi- or multi-stable configurations) position and then return to their original state (see FIG. 16B) without much delay (a few milliseconds) thereby providing a "click" or other haptic feedback (signal) effect.

FIGS. 16C and 16D show close-ups of pillars 1604 attached to the end of bistable material hinges 1602, such as that shown in FIG. 16B. Bistable material hinge 1602 is suitably attached to the top of carrier plate 1606 allowing for motion and extension into a hollow cavity (see FIG. 16C). Bistable material hinge 1602 can be attached either fixedly or through some easily mechanical rotatable means to pillar 1604 and pillar 1604 then drives the end of the hinge down or up as shown in FIGS. 16C and 16D, such that there can be a vertical change Δ.

Figure 17:
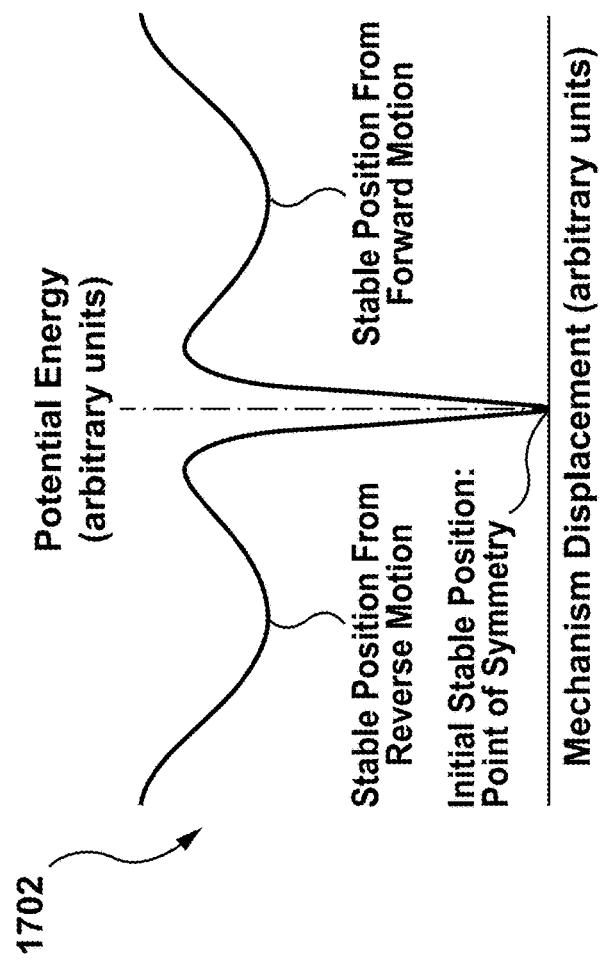
FIG. 17 shows an energy plot of a tristable material in accordance with an embodiment hereof.
Figure 18:
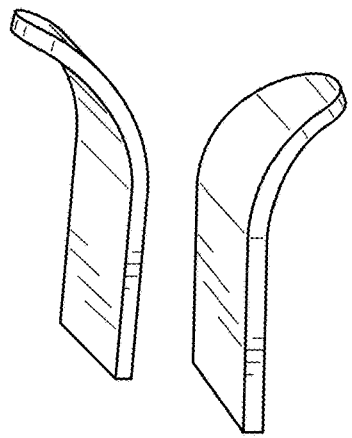
FIG. 18 shows a bistable material hinge in accordance with an embodiment hereof.
Figure 19C:
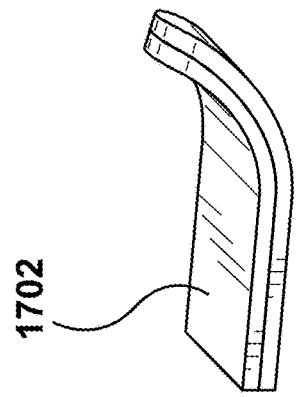
FIGS. 19A-19C show bistable material hinges in accordance with an embodiment hereof.
Figure 19B:
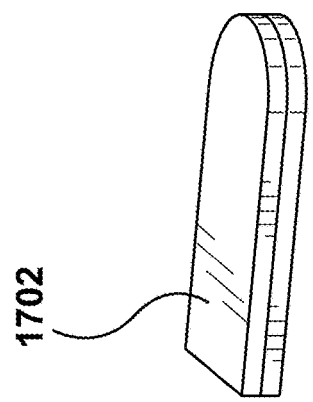
Figure 19A:
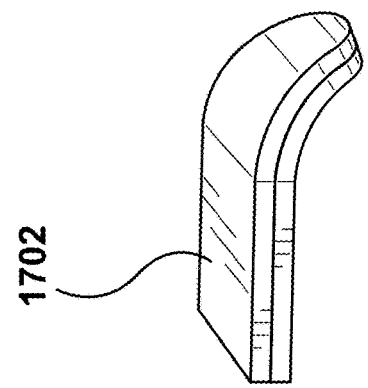

FIG. 17 shows a plot of mechanism displacement versus potential energy for a tristable system 1702. One way of constructing a tristable system is to use to bistable material hinge 1602 as is shown in FIGS. 18 and 19A-19C. When laminated together as shown in FIGS. 19A-19C, the hinge end can be stable when it drops down as shown in FIG. 19A, when it is nearly flat shown and FIG. 19B, and when the hinge end is raised as shown in FIG. 19C.

Figure 20A:
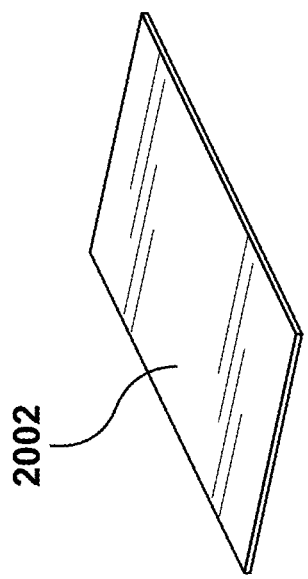
FIGS. 20A-20B show bistable material hinges in accordance with an embodiment hereof.
Figure 20B:
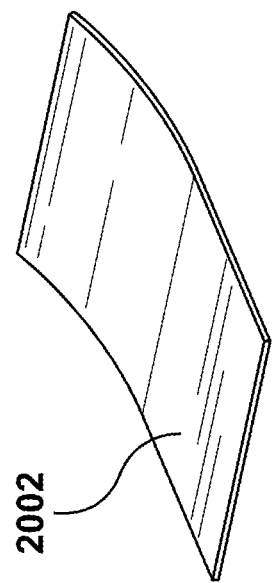

In further embodiments, a bistable material as described herein can be implemented in phone case 2002. For example, FIGS. 20A and 20B show a typical example of one part (top or bottom) side of a mobile phone case. When the user receives a phone/message, the bistable material in phone case 202 is activated and changes shape. In the configuration as shown in FIGS. 20A and 20B, this occurs from 20A to 20B (changing the shape). For example, the user can place a phone on a desk (away from a user's hand) and then notices that the phone case shape is changed. Therefore, the user knows that something has been received (phone call, message, mail, etc.). Another scenario is that when the user has a phone in a pocket and then notices that the phone case has created a force on his body (haptic signal) due to the change. As a result, the user is notified of a new activity (phone call, message, mail, etc.).

Several embodiments are specifically illustrated and/or described herein. However, it will be appreciated that modifications and variations of the disclosed embodiments are covered by the above teachings and within the purview of the appended claims without depending from the spirit and intended scope of the invention.

What is claimed is:

1. A haptic feedback generator, comprising:
  a. a structural material that is a fabric, textile, leather, suede, pliable metallic or body armor;
  b. a bistable material comprising a shape memory polymer (SMP) in the form of a fiber configured in a first bistable configuration and made part of the structural material;
  c. a first actuator coupled to the bistable material which when activated causes the bistable material to move from the first bistable configuration to a second bistable configuration, thereby generating haptic feedback; and
  d. a first actuator activation signal receiver, which upon receipt of an actuator activation signal, initiates activation of the first actuator.

2. The haptic feedback generator of claim 1, wherein the actuator is a shape memory material alloy (SMA) or macro fiber composite (MFC) coupled to the bistable material.

3. The haptic feedback generator of claim 1, wherein the actuator is a heat source.

4. The haptic feedback generator of claim 1, wherein the actuator is configured so that the movement of the bistable material is reversible.

5. The haptic feedback generator of claim 1, wherein the structural material is part of a wearable.

6. The haptic feedback generator of claim 1, wherein the structural material is a textile.

7. The haptic feedback generator of claim 1, wherein the actuator is a piezoelectric material.

8. The haptic feedback generator of claim 1, further comprising:
  a. a second actuator coupled to the bistable material which when activated causes the bistable material to move from the second bistable configuration to the first bistable configuration;
  b. a second actuator activation signal receiver, which upon receipt of a second actuator activation signal, initiates activation of the second actuator.

9. A method of providing haptic feedback to a user, comprising:
  a. receiving a haptic initiation signal from a source;
  b. activating a first actuator coupled to a bistable material comprising a shape memory polymer in the form of a fiber and made part of a structural material, when the haptic initiation signal is received from the source; and
  c. providing haptic feedback to the user by moving the bistable material from a first bistable configuration to a second bistable configuration upon activating the first actuator.

10. The method of claim 9, wherein the bistable material is part of a wearable.

11. The method of claim 9, wherein the actuator is a shape memory material alloy (SMA) or macro fiber composite (WC) coupled to the bistable material.

12. The method of claim 9, wherein the actuator is a heat source.

13. The method of claim 9, wherein the actuator is configured so that the movement of the bistable material is reversible.

* * * * *

UNITED STATES PATENT AND TRADEMARK OFFICE
CERTIFICATE OF CORRECTION

PATENT NO. : 10,366,583 B2
APPLICATION NO. : 15/239962
DATED : July 30, 2019
INVENTOR(S) : Vahid Khoshkava et al.

Page 1 of 1

It is certified that error appears in the above-identified patent and that said Letters Patent is hereby corrected as shown below:

In the Claims

Claim 11, Column 12, Line 59:
"(WC) coupled to the bistable material" is corrected to --(MFC) coupled to the bistable material--

Signed and Sealed this
Twenty-first Day of April, 2020

Andrei Iancu
*Director of the United States Patent and Trademark Office*